(12) United States Patent
Masutani et al.

(10) Patent No.: US 7,505,806 B2
(45) Date of Patent: Mar. 17, 2009

(54) FIBER RENDERING APPARATUS

(75) Inventors: Yoshitaka Masutani, Tokyo (JP); Osamu Abe, Tokyo (JP); Shigeki Aoki, Tokyo (JP); Hiroyuki Kabasawa, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 754 days.

(21) Appl. No.: 10/626,320

(22) Filed: Jul. 24, 2003

(65) Prior Publication Data

US 2005/0101857 A1 May 12, 2005

(30) Foreign Application Priority Data

Aug. 29, 2002 (JP) ............................. 2002-250628

(51) Int. Cl.
*A61B 5/05* (2006.01)
*G06K 9/00* (2006.01)
*G01V 3/00* (2006.01)

(52) U.S. Cl. ...................... 600/410; 382/128; 324/307; 324/309

(58) Field of Classification Search ................. 600/410; 324/307, 309; 382/128
See application file for complete search history.

(56) References Cited

U.S. PATENT DOCUMENTS

| | | | |
|---|---|---|---|
| 5,749,362 A | 5/1998 | Funda et al. | |
| 5,969,524 A * | 10/1999 | Pierpaoli et al. | 324/307 |
| 6,205,235 B1 | 3/2001 | Roberts | |
| 6,298,259 B1 | 10/2001 | Kucharczyk et al. | |
| 6,430,430 B1 | 8/2002 | Gosche | |
| 6,516,214 B1 | 2/2003 | Boas | |
| 6,526,305 B1 * | 2/2003 | Mori | 600/410 |
| 6,577,884 B1 | 6/2003 | Boas | |
| 2003/0234781 A1 * | 12/2003 | Laidlaw et al. | 345/419 |

FOREIGN PATENT DOCUMENTS

JP 11000320 1/1999

OTHER PUBLICATIONS

Aoki, et al., MRI On Central Nervous System, New Medicine in Japan, Jun. 2002, pp. 72-75.

* cited by examiner

*Primary Examiner*—Eric F Winakur
*Assistant Examiner*—Michael T Rozanski
(74) *Attorney, Agent, or Firm*—Armstrong Teasdale LLP

(57) ABSTRACT

For the purpose of preventing a situation in which the fiber density looks as if it suddenly decreases in a specific view direction, a method comprises: specifying a region of interest R1 in MR image data collected by a diffusion tensor method; defining regular grid points in the region of interest R1; defining points obtained by randomly moving the grid points as tracking start points S1, S2, . . . ; performing diffusion tensor analysis on each tracking start point S1, S2, . . . in the image data to determine a direction of a principal axis vector; tracking a fiber by repeatedly selecting a neighbor point along the direction of the principal axis vector and performing diffusion tensor analysis on the neighbor point to determine the direction of the principal axis vector; and producing and displaying an image of the tracked fibers as viewed in a desired view direction.

20 Claims, 17 Drawing Sheets

View direction

View direction

FIG. 18

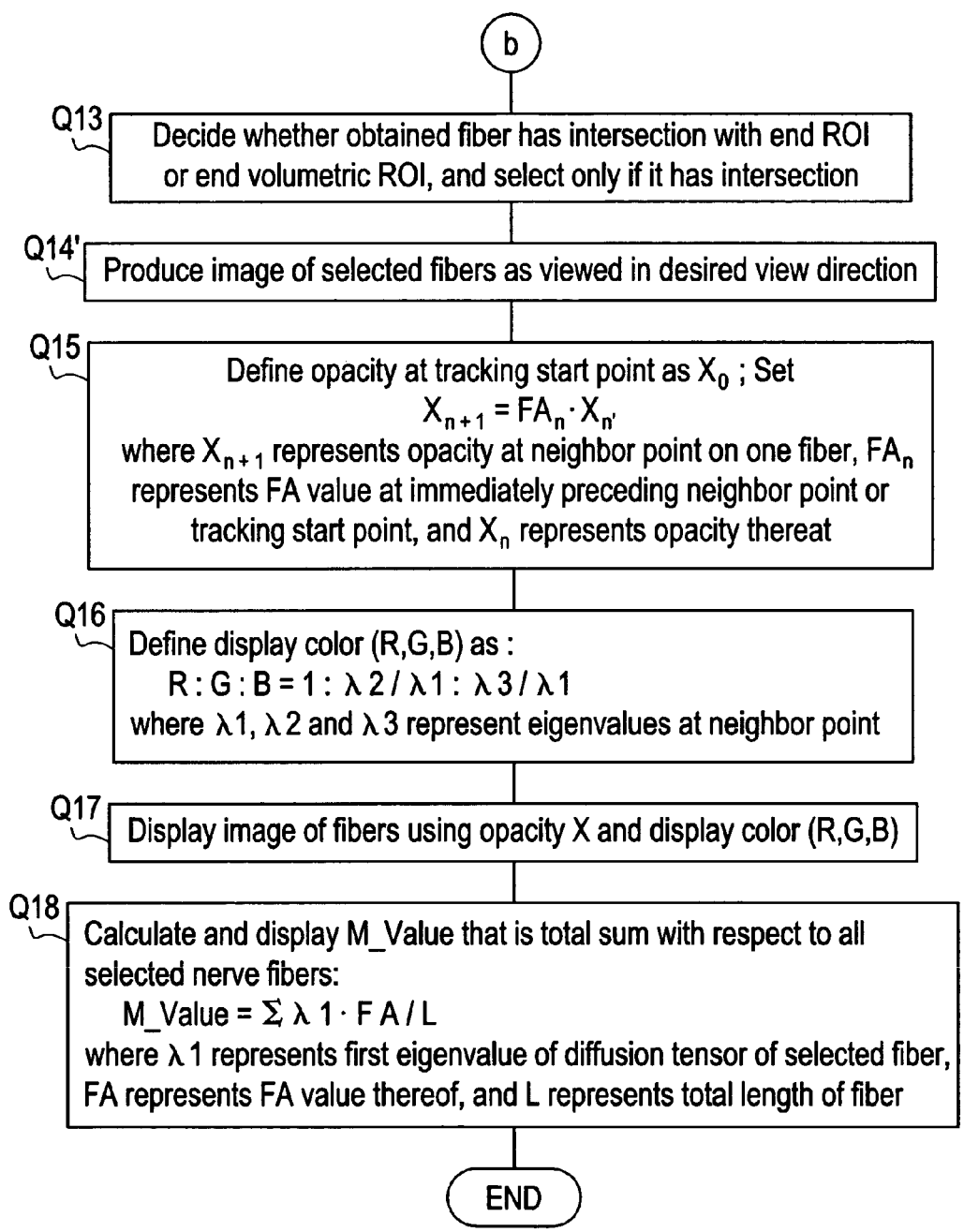

(b)
↓
Q13: Decide whether obtained fiber has intersection with end ROI or end volumetric ROI, and select only if it has intersection

Q14': Produce image of selected fibers as viewed in desired view direction

Q15: Define opacity at tracking start point as $X_0$ ; Set
$$X_{n+1} = FA_n \cdot X_{n'}$$
where $X_{n+1}$ represents opacity at neighbor point on one fiber, $FA_n$ represents FA value at immediately preceding neighbor point or tracking start point, and $X_n$ represents opacity thereat

Q16: Define display color (R,G,B) as :
$$R : G : B = 1 : \lambda 2 / \lambda 1 : \lambda 3 / \lambda 1$$
where $\lambda 1$, $\lambda 2$ and $\lambda 3$ represent eigenvalues at neighbor point

Q17: Display image of fibers using opacity X and display color (R,G,B)

Q18: Calculate and display M_Value that is total sum with respect to all selected nerve fibers:
$$M\_Value = \Sigma\, \lambda 1 \cdot FA / L$$
where $\lambda 1$ represents first eigenvalue of diffusion tensor of selected fiber, FA represents FA value thereof, and L represents total length of fiber

END

View direction

View direction

FIBER RENDERING APPARATUS

BACKGROUND OF THE INVENTION

The present invention relates to a fiber rendering method and MRI (magnetic resonance imaging) apparatus, and more particularly to a method and MRI apparatus for properly rendering brain white matter fibers obtained by diffusion tensor imaging.

FIG. 21 is a flow chart showing a conventional fiber rendering method.

At Step P1, an MR image in an axial or oblique plane is produced from three-dimensional image data collected by a diffusion tensor method or another imaging method (T1- or T2-enhanced or the like) in an MRI apparatus, and the MR image is displayed.

At Step P2, an operator specifies a two-dimensional region of interest R1 (or a three-dimensional volumetric region of interest) on a displayed MR image G1, as shown in FIG. 22.

At Step P3', regular grid points are generated in the region of interest R1 (or in the volumetric region of interest) as shown in FIG. 23, and they are defined as tracking start points S1, S2, S3, . . . .

At Step P5, one of the tracking start points is selected.

At Step P6', diffusion tensor analysis is performed on the selected tracking start point in the three-dimensional image data collected by the diffusion tensor method in the MRI apparatus to determine the direction of the principal axis vector, i.e., the direction of the first eigenvector.

At Step P7, if a point at a unit distance along the direction of the principal axis vector falls within the three-dimensional image data space, the point is defined as a neighbor point and the flow proceeds to Step P8'; and if the point falls outside the three-dimensional image data space, the flow proceeds to Step P11.

At Step P8', data at the neighbor point is created by interpolation or the like on the three-dimensional image data, and diffusion tensor analysis is performed to determine the direction of the principal axis vector and the FA (fractional anisotropy) value.

At Step P9, if the FA value is equal to or more than a threshold, the flow goes back to Step P7 to continue the fiber tracking because the fiber tracking has not reached an end portion of a brain white matter fiber; and if the FA value is less than the threshold, the flow proceeds to Step P11 to terminate the fiber tracking because an end portion of a brain white matter fiber has been reached.

In this way, Steps P7-P9 are repeated until no more three-dimensional image data are found or the fiber tracking has reached an end portion of a brain white matter fiber, and a fiber is tracked from the tracking start point S1 to a neighbor point N1, N2, N3, . . . , as exemplarily shown in FIG. 24. At that time, connectivity is decided by using a scalar product of vectors, for example.

At Step P11, points from the tracking start point to the last neighbor point are saved as one brain white matter fiber.

At Step P12, if any tracking start point not selected at Step P5 remains, the flow goes back to Step P5; otherwise, proceeds to Step P14'.

At Step P14', an image of the saved brain white matter fibers as viewed in a desired view direction is produced and displayed, as exemplarily shown in FIG. 25.

A diffusion tensor and a nerve fiber extending direction are described in, for example, "Microstructural and Physiological Features of Tissues Elucidated by Ouantitative-Diffusion-Tensor MRI" by Peter J. Basser and Carlo Pierpaoli, *Journal of Magnetic Resonance*, Series B 111, pp. 209-219 (1996), and in "Diffusion Anisotropy—2D and 3D images of Brain White Matter Fibers—" by Yasuomi Kinosada (Kyoto Prefectural University of Medicine, Department of Radiology), the 30 th Meeting of MR Imaging Study Group, Sep. 4, 1998, at Sapporo, Japan.

SUMMARY OF THE INVENTION

When the grid points regularly generated at Step P3 in FIG. 21 are defined as the tracking start points, the fiber density looks as if it suddenly decreases when the view direction is parallel to a direction of the grid point arrangement, because the nerve fibers passing through the tracking start points lining up in the view direction appear to overlap one another, leading to a problem that the image gives an unnatural impression.

Thus, a first object of the present invention is to provide a fiber rendering method capable of preventing a situation in which the fiber density looks as if it suddenly decreases in a specific view direction.

When the threshold at Step P9 in FIG. 21 is small, even a portion having a considerably low FA value, i.e., a portion with considerably low fiber tracking reliability, is rendered. The portion with considerably low fiber tracking reliability is, however, rendered in the same manner of display as that for rendering a portion with high reliability, and these portions cannot be distinguished, leading to the problem that this poses a hindrance to accurate diagnosis. On the other hand, when the threshold at Step P9 in FIG. 21 is large, the fiber tracking is aborted before an end portion of a brain white matter fiber is reached, leading to a problem that fibers cannot be fully rendered.

Thus, a second object of the present invention is to provide a fiber rendering method capable of rendering fibers in a manner of display that incorporates the degree of fiber tracking reliability.

In the conventional technique, since eigenvalues of diffusion tensors are not incorporated in display of tracked fibers, there is a problem that variation in eigenvalues of diffusion tensors cannot be seen when observing the rendered fibers.

Thus, a third object of the present invention is to provide a fiber rendering method capable of rendering fibers in a manner of display that incorporates variation in the eigenvalues of diffusion tensors.

As shown in FIG. 27, at a nerve fiber intersection C, nerve fibers having different connection directions intersect each other. The conventional tracking, however, employs only the direction of the principal axis vector at a selected neighbor point, and therefore it cannot distinguish between fibers that intersect each other at a nerve fiber intersection, leading to a problem that the tracking direction may be mistaken as shown in FIG. 28.

Thus, a fourth object of the present invention is to provide a fiber rendering method capable of conducting tracking without mistaking the direction even at a portion where nerve fibers having different connection directions intersect each other.

In diagnosing leukodystrophy, for example, knowledge about whether connection by fiber nerves between two sites has been destroyed provides useful information.

Thus, a fifth object of the present invention is to provide a fiber rendering method by which connectivity by fiber nerves between two sites that an operator specifies can be visually recognized.

In accordance with its first aspect, the present invention provides a fiber rendering method characterized in comprising: specifying a region of interest or volumetric region of interest in three-dimensional image data collected by a diffusion tensor method in an MRI apparatus; defining regular grid points in the region of interest or volumetric region of interest; then defining points obtained by randomly moving the grid points in a two-dimensional or three-dimensional manner as tracking start points; performing diffusion tensor analysis on each tracking start point in the three-dimensional image data to determine a direction of a principal axis vector; tracking a fiber by repeatedly selecting a neighbor point along the direction of the principal axis vector and performing diffusion tensor analysis on the neighbor point to determine a direction of a principal axis vector; and producing and displaying an image of the tracked fibers as viewed in a desired view direction.

In the fiber rendering method of the first aspect, the number of tracking start points overlapping one another is approximately the same in any view direction. Therefore, a situation in which the fiber density looks as if it suddenly decreases in a specific view direction is prevented. Taking an overall view of the region of interest or volumetric region of interest, the density of the track start points is uniform and no density variation occurs.

In accordance with its second aspect, the present invention provides a fiber rendering method characterized in comprising: defining tracking start points in three-dimensional image data collected by a diffusion tensor method in an MRI apparatus; performing diffusion tensor analysis on each tracking start point in the three-dimensional image data to determine a direction of a principal axis vector and a diffusion anisotropy value; tracking a fiber by repeatedly selecting a neighbor point along the direction of the principal axis vector and performing diffusion tensor analysis on the neighbor point to determine a direction of a principal axis vector and a diffusion anisotropy value; and producing an image of the tracked fibers as viewed in a desired view direction and displaying the image with opacity reflecting the diffusion anisotropy values at the tracking start points and neighbor points.

In the fiber rendering method of the second aspect, the transparency of a fiber to be rendered is changed according to the diffusion anisotropy value. Therefore, the degree of fiber tracking reliability can be visually recognized from the transparency of the rendered fibers.

In accordance with its third aspect, the present invention provides the fiber rendering method having the aforementioned configuration, characterized in that an FA value is used as the diffusion anisotropy value.

In the fiber rendering method of the third aspect, the transparency of a fiber to be rendered can be changed according to an FA value that takes a value between zero and one depending upon the diffusion anisotropy.

In accordance with its fourth aspect, the present invention provides the fiber rendering method having the aforementioned configuration, characterized in that:

$$X_{n+1}=FA_n \cdot X_n,$$

where $X_{n+1}$ represents an opacity at a neighbor point, $FA_n$ represents an FA value at the immediately preceding neighbor point or tracking start point, and $X_n$ represents an opacity thereat.

In the fiber rendering method of the fourth aspect, the transparency can be gradually increased from the tracking start point toward an end portion, and sharply increased at the end portion.

In accordance with its fifth aspect, the present invention provides a fiber rendering method characterized in comprising: defining tracking start points in three-dimensional image data collected by a diffusion tensor method in an MRI apparatus; performing diffusion tensor analysis on each tracking start point in the three-dimensional image data to determine a direction of a principal axis vector and eigenvalues of a diffusion tensor; tracking a fiber by repeatedly selecting a neighbor point along the direction of the principal axis vector and performing diffusion tensor analysis on the neighbor point to determine a direction of a principal axis vector and eigenvalues of a diffusion tensor; and producing an image of the tracked fibers as viewed in a desired view direction and displaying the image with display colors reflecting the eigenvalues of the diffusion tensors at the tracking start points and neighbor points.

In the fiber rendering method of the fifth aspect, the display color of fibers to be rendered is changed according to the eigenvalues of the diffusion tensors. Therefore, the change in the eigenvalues of the diffusion tensors can be visually recognized by the change in the display color of the rendered fibers.

In accordance with its sixth aspect, the present invention provides the fiber rendering method having the aforementioned configuration, characterized in that: a display color (R, G, B) is defined as:

$$R:G:B=1:\lambda 2/\lambda 1:\lambda 3/\lambda 1,$$

where $\lambda 1$, $\lambda 2$ and $\lambda 3$ represent eigenvalues of a diffusion tensor.

In the fiber rendering method of the sixth aspect, the diffusion can be known to be more isotropic as the display color is closer to white, and to be more anisotropic as the display color is closer to red.

In accordance with its seventh aspect, the present invention provides a fiber rendering method characterized in comprising: defining tracking start points in three-dimensional image data collected by a diffusion tensor method in an MRI apparatus; performing diffusion tensor analysis on each tracking start point in the three-dimensional image data to determine a direction of a principal axis vector and defining the direction of the principal axis vector as a tracking direction vector; tracking a fiber by repeatedly selecting a neighbor point along the tracking direction vector, performing diffusion tensor analysis on the neighbor point to obtain diffusion tensor information, and determining a tracking direction vector from the diffusion tensor information and at least an immediately preceding tracking direction vector; and producing and displaying an image of the tracked fibers as viewed in a desired view direction.

In the fiber rendering method of the seventh aspect, since a new tracking direction vector is determined from diffusion tensor information of a neighbor point and at least an immediately preceding tracking direction vector, nerve fibers in different connection directions can be distinguished based on the preceding connection directions even at a portion at which the nerve fibers in different connection directions intersect each other, and the nerve fibers can be tracked without mistaking the direction.

In accordance with its eighth aspect, the present invention provides the fiber rendering method having the aforementioned configuration, characterized in that:

$$d_{i+1}=\{\lambda 1(e_1 \cdot d_i)e_1+\lambda 2(e_2 \cdot d_i)e_2+\lambda 3(e_3 \cdot d_i)e_3\}/|\lambda 1(e_1 \cdot d_i)e_1+\lambda 2(e_2 \cdot d_i)e_2+\lambda 3(e_3 \cdot d_i)e_3|,$$

where $\lambda 1$, $\lambda 2$ and $\lambda 3$ represent eigenvalues of a diffusion tensor at a neighbor point, e1, e2 and e3 represent eigenvectors thereat, $d_{i+1}$ represents a tracking direction vector thereat, and $d_i$ represents a tracking direction vector at an immediately preceding neighbor point or tracking start point.

In the fiber rendering method of the eighth aspect, a tracking direction vector $d_{i+1}$ can be determined from an immediately preceding tracking direction vector $d_i$, and eigenvalues of a diffusion tensor $\lambda 1, \lambda 2$ and $\lambda 3$ and eigenvectors e1, e2 and e3 at a neighbor point.

In accordance with its ninth aspect, the present invention provides a fiber rendering method characterized in comprising: specifying a start region of interest and an end region of interest or a start volumetric region of interest and an end volumetric region of interest in three-dimensional image data collected by a diffusion tensor method in an MRI apparatus; defining tracking start points in the start region of interest or start volumetric region of interest; tracking a fiber by performing diffusion tensor analysis from each tracking start point in the three-dimensional image data; deciding whether each tracked fiber passes through the end region of interest or end volumetric region of interest; and producing and displaying an image of only the fibers that are decided to pass through as viewed in a desired view direction.

In the fiber rendering method of the ninth aspect, since only the nerve fibers passing through two sites are rendered, connectivity of the nerve fibers between the two sites can be visually recognized.

In accordance with its tenth aspect, the present invention provides the fiber rendering method having the aforementioned configuration, characterized in comprising: calculating and displaying a total sum with respect to all the fibers decided to pass through:

$$M\_Value = \Sigma \lambda 1 \cdot FA/L,$$

where $\lambda 1$ represents a first eigenvalue of a diffusion tensor of a fiber decided to pass through, FA represents an FA value thereof, and L represents the total length of the fiber.

In the fiber rendering method of the tenth aspect, quantitative assessment is enabled by employing M_Value as an indicator of the strength of connection by nerve fibers between two sites.

In accordance with its eleventh aspect, the present invention provides a fiber rendering apparatus characterized in comprising: means for specifying a region of interest or volumetric region of interest in three-dimensional image data collected by a diffusion tensor method in an MRI apparatus; means for defining regular grid points in the region of interest or volumetric region of interest; means for defining points obtained by randomly moving the grid points in a two-dimensional or three-dimensional manner as tracking start points; means for performing diffusion tensor analysis on each tracking start point in the three-dimensional image data to determine a direction of a principal axis vector; means for tracking a fiber by repeatedly selecting a neighbor point along the direction of the principal axis vector and performing diffusion tensor analysis on the neighbor point to determine a direction of a principal axis vector; and means for producing and displaying an image of the tracked fibers as viewed in a desired view direction.

In the fiber rendering apparatus of the eleventh aspect, the fiber rendering method of the first aspect can be suitably implemented.

In accordance with its twelfth aspect, the present invention provides a fiber rendering apparatus characterized in comprising: means for defining tracking start points in three-dimensional image data collected by a diffusion tensor method in an MRI apparatus; means for performing diffusion tensor analysis on each tracking start point in the three-dimensional image data to determine a direction of a principal axis vector and a diffusion anisotropy value; means for tracking a fiber by repeatedly selecting a neighbor point along the direction of the principal axis vector and performing diffusion tensor analysis on the neighbor point to determine a direction of a principal axis vector and a diffusion anisotropy value; and means for producing an image of the tracked fibers as viewed in a desired view direction and displaying the image with opacity reflecting the diffusion anisotropy values at the tracking start points and neighbor points.

In the fiber rendering apparatus of the twelfth aspect, the fiber rendering method of the second aspect can be suitably implemented.

In accordance with its thirteenth aspect, the present invention provides the fiber rendering apparatus having the aforementioned configuration, characterized in that an FA value is used as the diffusion anisotropy value.

In the fiber rendering apparatus of the thirteenth aspect, the fiber rendering method of the third aspect can be suitably implemented.

In accordance with its fourteenth aspect, the present invention provides the fiber rendering apparatus having the aforementioned configuration, characterized in that:

$$X_{n+1} = FA_n \cdot X_n,$$

where $X_{n+1}$ represents an opacity at a neighbor point, $FA_n$ represents an FA value at the immediately preceding neighbor point or tracking start point, and $X_n$ represents an opacity thereat.

In the fiber rendering apparatus of the fourteenth aspect, the fiber rendering method of the fourth aspect can be suitably implemented.

In accordance with its fifteenth aspect, the present invention provides a fiber rendering apparatus characterized in comprising: means for defining tracking start points in three-dimensional image data collected by a diffusion tensor method in an MRI apparatus; means for performing diffusion tensor analysis on each tracking start point in the three-dimensional image data to determine a direction of a principal axis vector and eigenvalues of a diffusion tensor; means for tracking a fiber by repeatedly selecting a neighbor point along the direction of the principal axis vector and performing diffusion tensor analysis on the neighbor point to determine a direction of a principal axis vector and eigenvalues of a diffusion tensor; and means for producing an image of the tracked fibers as viewed in a desired view direction and displaying the image with display colors reflecting the eigenvalues of the diffusion tensors at the tracking start points and neighbor points.

In the fiber rendering apparatus of the fifteenth aspect, the fiber rendering method of the fifth aspect can be suitably implemented.

In accordance with its sixteenth aspect, the present invention provides the fiber rendering apparatus having the aforementioned configuration, characterized in that: a display color (R, G, B) is defined as:

$$R:G:B = 1:\lambda 2/\lambda 1:\lambda 3/\lambda 1,$$

where $\lambda 1$, $\lambda 2$ and $\lambda 3$ represent eigenvalues of a diffusion tensor.

In the fiber rendering apparatus of the sixteenth aspect, the fiber rendering method of the sixth aspect can be suitably implemented.

In accordance with its seventeenth aspect, the present invention provides a fiber rendering apparatus characterized in comprising: means for defining tracking start points in three-dimensional image data collected by a diffusion tensor method in an MRI apparatus; means for performing diffusion tensor analysis on each tracking start point in the three-dimensional image data to determine a direction of a principal axis vector and defining the direction of the principal axis vector as a tracking direction vector; means for tracking a fiber by repeatedly selecting a neighbor point along the tracking direction vector, performing diffusion tensor analysis on the neighbor point to obtain diffusion tensor information, and determining a tracking direction vector from the diffusion tensor information and at least an immediately preceding tracking direction vector; and means for producing and displaying an image of the tracked fibers as viewed in a desired view direction.

In the fiber rendering apparatus of the seventeenth aspect, the fiber rendering method of the seventh aspect can be suitably implemented.

In accordance with its eighteenth aspect, the present invention provides the fiber rendering apparatus having the aforementioned configuration, characterized in that:

$$d_{i+1}=\{\lambda 1(e_1 \cdot d_i)e_1+\lambda 2(e_2 \cdot d_i)e_2+\lambda 3(e_3 \cdot d_i)e_3\}/|\lambda 1(e_1 \cdot d_i)e_1+\lambda 2(e_2 \cdot d_i)e_2+\lambda 3(e_3 \cdot d_i)e_3|,$$

where $\lambda 1, \lambda 2$ and $3$ represent eigenvalues of a diffusion tensor at a neighbor point, $e1$, $e2$ and $e3$ represent eigenvectors thereat, $d_{i+1}$ represents a tracking direction vector thereat, and $d_i$ represents a tracking direction vector at an immediately preceding neighbor point or tracking start point.

In the fiber rendering apparatus of the eighteenth aspect, the fiber rendering method of the eighth aspect can be suitably implemented.

In accordance with its nineteenth aspect, the present invention provides a fiber rendering apparatus characterized in comprising: means for specifying a start region of interest and an end region of interest or a start volumetric region of interest and an end volumetric region of interest in three-dimensional image data collected by a diffusion tensor method in an MRI apparatus; means for defining tracking start points in the start region of interest or start volumetric region of interest; means for tracking a fiber by performing diffusion tensor analysis from each tracking start point in the three-dimensional image data; means for deciding whether each tracked fiber passes through the end region of interest or end volumetric region of interest; and means for producing and displaying an image of only the fibers that are decided to pass through as viewed in a desired view direction.

In the fiber rendering apparatus of the nineteenth aspect, the fiber rendering method of the ninth aspect can be suitably implemented.

In accordance with its twentieth aspect, the present invention provides the fiber rendering apparatus having the aforementioned configuration, characterized in comprising: means for calculating and displaying a total sum with respect to all the fibers decided to intersect:

$$M\_Value = \Sigma \lambda 1 \cdot FA/L,$$

where $\lambda 1$ represents a first eigenvalue of a diffusion tensor of a fiber decided to pass through, FA represents an FA value thereof, and L represents the total length of the fiber.

In the fiber rendering apparatus of the twentieth aspect, the fiber rendering method of the tenth aspect can be suitably implemented.

According to the fiber rendering method and fiber rendering apparatus of the present invention, the following effects can be obtained:

(1) The number of tracking start points overlapping one another is approximately the same in various view directions. Therefore, a situation in which the fiber density looks as if it suddenly decreases in a specific view direction is prevented. Taking an overall view of the region of interest or volumetric region of interest, the density of the track start points is uniform and no density variation occurs;

(2) A portion of a rendered fiber having low transparency can be known to have high fiber tracking reliability, and a portion having high transparency can be known to have low fiber tracking reliability. Therefore, even when a portion having considerably low fiber tracking reliability is rendered, the portion with considerably low fiber tracking reliability and the portion with high reliability can be distinguished, which avoids hindrance to accurate diagnosis;

(3) Whether diffusion is isotropic or anisotropic can be visually recognized from the display color of rendered fibers;

(4) Nerve fibers in different connection directions can be distinguished based on the preceding connection directions even at a portion at which the nerve fibers in different connection directions intersect each other, and the nerve fibers can be tracked without mistaking the direction;

(5) Since only the nerve fibers passing through two sites can be rendered, connectivity of the nerve fibers between the two sites can be visually recognized; and (6) Quantitative assessment on the strength of connection by nerve fibers between two sites is enabled.

Further objects and advantages of the present invention will be apparent from the following description of the preferred embodiments of the invention as illustrated in the accompanying drawings.

BRIEF DESCRIPTION OF THE DRAWINGS

FIG. 18 is a flow chart continued from FIG. 17.

DETAILED DESCRIPTION OF THE INVENTION

The present invention will now be described in more detail with reference to embodiments shown in the accompanying drawings.

First Embodiment

Figure 1:
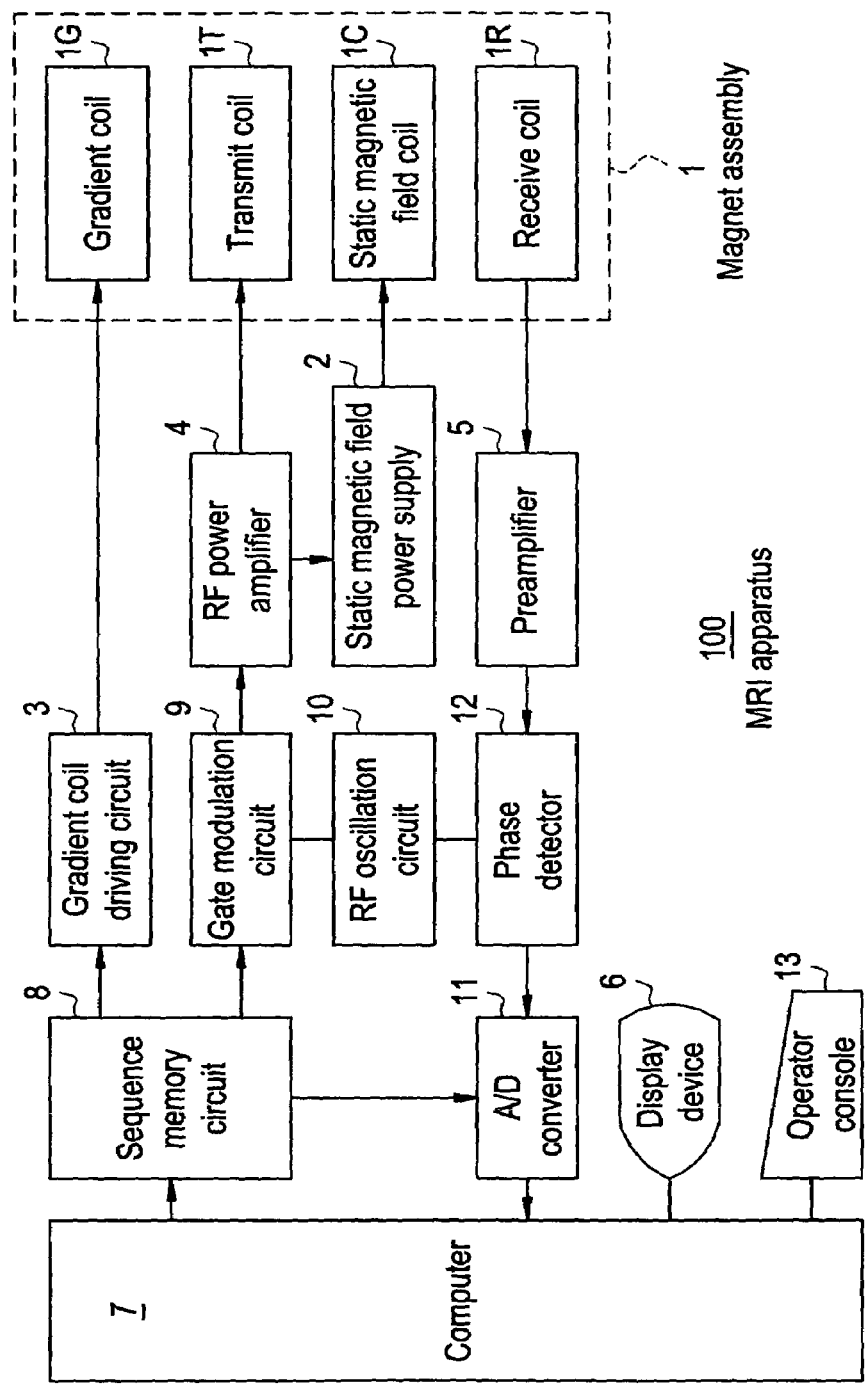
FIG. 1 is a block diagram showing an MRI apparatus in accordance with a first embodiment.

FIG. 1 is a block diagram showing an MRI apparatus in accordance with one embodiment of the present invention.

In the MRI apparatus 100, a magnet assembly 1 has a bore (cavity portion) for inserting therein a subject, and is provided, surrounding the bore, with a gradient coil (which comprises X-axis, Y-axis and Z-axis coils, and the combination thereof determines slice, warp and read axes) 1G for generating gradient magnetic fields, a transmit coil 1T for applying RF pulses for exciting spins of atomic nuclei within the subject, a receive coil 1R for detecting NMR signals from the subject, and a static magnetic field power supply 2 and static magnetic field coil 1C for generating a static magnetic field.

It should be noted that permanent magnets may be employed in place of the static magnetic field power supply 2 and static magnetic field coil 1C (superconductive coil).

The gradient coil 1G is connected to a gradient coil driving circuit 3. The transmit coil 1T is connected to an RF power amplifier 4. The receive coil 1R is connected to a preamplifier 5.

A sequence memory circuit 8 operates the gradient coil driving circuit 3 based on a stored pulse sequence in response to instructions from a computer 7 to thereby generate gradient magnetic fields from the gradient coil 1G. The sequence memory circuit 8 also operates a gate modulation circuit 9 to modulate high frequency output signals from an RF oscillation circuit 10 into pulsed signals of predefined timing and envelope. The pulsed signals are applied to the RF power amplifier 4 as excitation pulses, power-amplified in the RF power amplifier 4, and then applied to the transmit coil 1T in the magnet assembly 1 to transmit RF pulses.

The preamplifier 5 amplifies NMR signals from the subject detected at the receive coil 1R in the magnet assembly 1, and inputs the signals to a phase detector 12. The phase detector 12 phase-detects the NMR signals from the preamplifier 5 employing the output from the RF oscillation circuit 10 as a reference signal, and supplies the phase-detected signals to an A/D converter 11. The A/D converter 11 converts the phase-detected analog signals into MR data in the form of digital signals, and inputs them to the computer 7.

The computer 7 reads the MR data from the A/D converter 11, and performs image reconstruction calculation to produce an MR image. The computer 7 is also responsible for overall control such as receiving information supplied from an operator console 13. Furthermore, the computer 7 conducts fiber rendering processing, which will be described later with reference to FIG. 2.

A display device 6 displays the MR image and a fiber image which will be described later.

Figure 2:
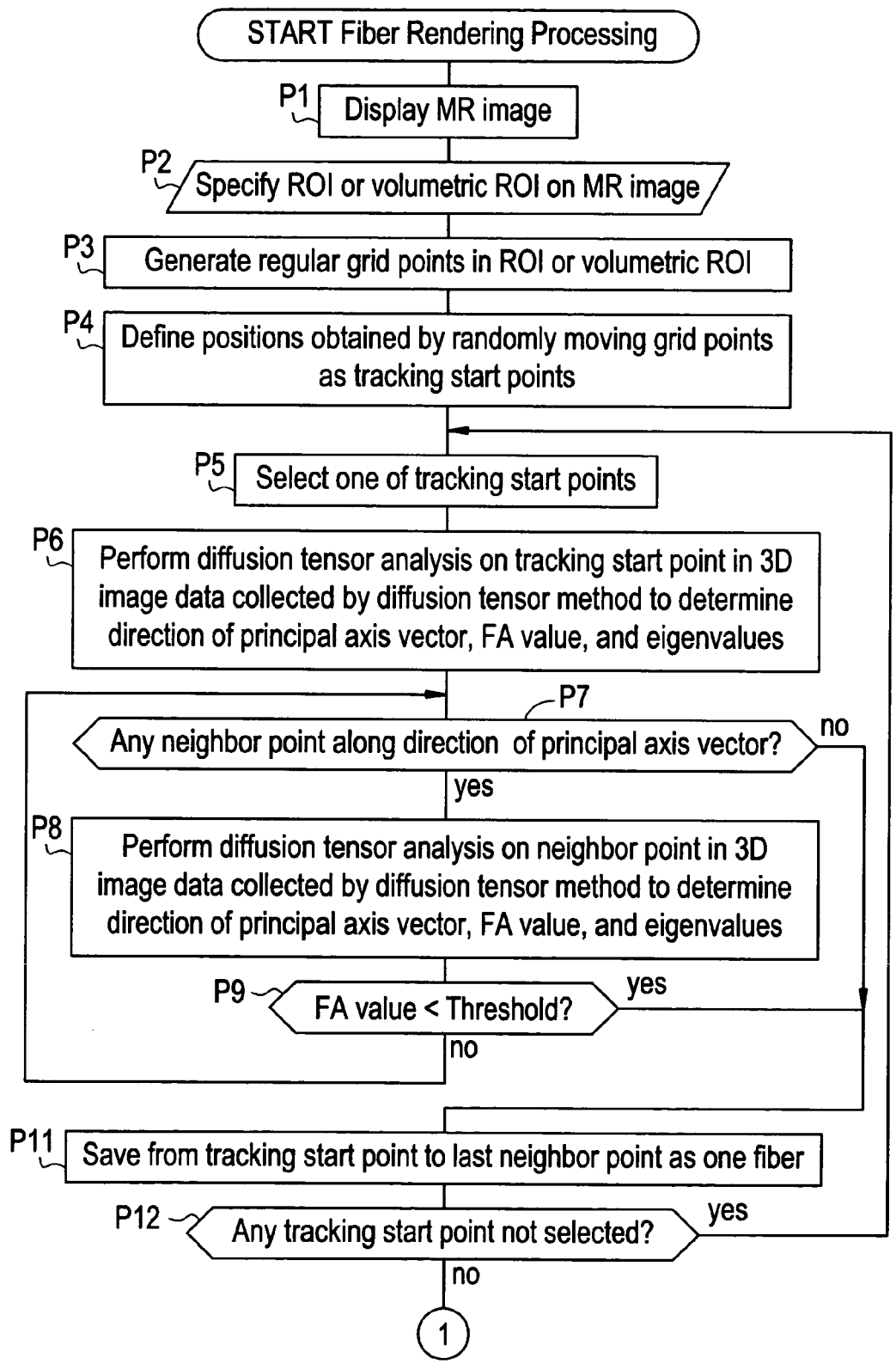
FIG. 2 is a flow chart showing fiber rendering processing in accordance with the first embodiment.

FIG. 2 is a flow chart showing fiber rendering processing by the MRI apparatus 100.

At Step P1, an MR image in an axial or oblique plane is produced from three-dimensional image data collected by a diffusion tensor method or another imaging method (T1- or T2-enhanced or the like) in the MRI apparatus 100, and the MR image is displayed.

Figure 4:
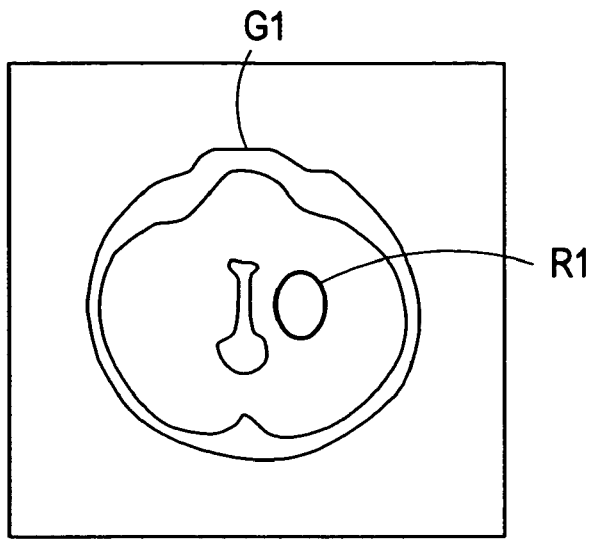
FIG. 4 exemplarily shows a screen for specifying a region of interest.

At Step P2, an operator specifies a two-dimensional region of interest R1 (or a three-dimensional volumetric region of interest) on a displayed MR image G1, as shown in FIG. 4.

Figure 5:
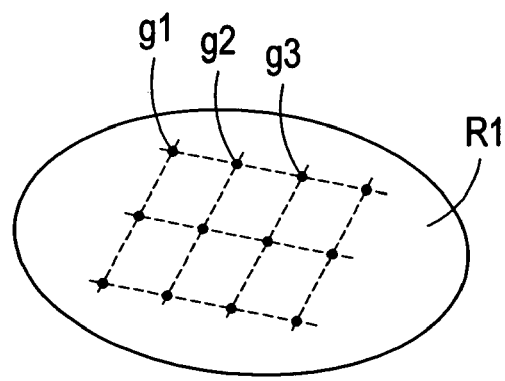
FIG. 5 exemplarily shows regularly arranged grid points.

At Step P3, regular grid points g1, g2, g3, . . . are generated in the region of interest R1 (or in the volumetric region of interest), as shown in FIG. 5.

Figure 6:
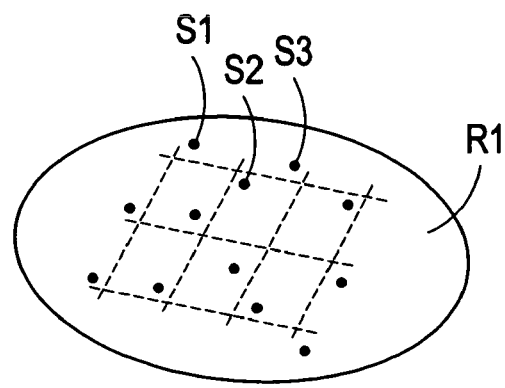
FIG. 6 exemplarily shows irregularly position-shifted tracking start points.

At Step P4, points obtained by randomly moving the grid points g1, g2, g3, . . . in a two-dimensional (or three-dimensional) manner are defined as tracking start points S1, S2, S3, . . . , as shown in FIG. 6. Random numbers for the random moving can be generated using a distribution function such as a Gaussian distribution or uniform distribution. The range of the moving may be defined so that most of the points after the moving fall within intervals between the grid points g1, g2, g3, . . . .

At Step P5, one of the tracking start points is selected.

At Step P6, diffusion tensor analysis is performed on the selected tracking start point in the three-dimensional image data collected by the diffusion tensor method in the MRI apparatus 100 to determine the direction of the principal axis vector, the FA value, and the eigenvalues.

At Step P7, if a point at a unit distance along the direction of the principal axis vector falls within the three-dimensional image data space, the point is defined as a neighbor point and the flow proceeds to Step P8; and if the point falls outside the three-dimensional image data space, the flow proceeds to Step P11.

At Step P8, data at the neighbor point is created by interpolation or the like on the three-dimensional image data, and diffusion tensor analysis is performed to determine the direction of the principal axis vector, the FA value, and the eigenvalues.

At Step P9, if the FA value is equal to or more than a threshold, the flow goes back to Step P7 to continue the fiber tracking because the fiber tracking has not reached an end portion of a brain white matter fiber; and if the FA value is less than the threshold, the flow proceeds to Step P11 to terminate the fiber tracking because an end portion of a brain white matter fiber has been reached.

Figure 7:
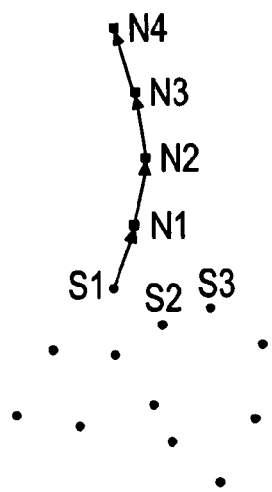
FIG. 7 is a conceptual diagram showing a fiber tracking condition.

In this way, Steps P7-P9 are repeated until no more three-dimensional image data are found or the fiber tracking has reached an end portion of a brain white matter fiber, and a fiber is tracked from the tracking start point S1 to a neighbor point N1, N2, N3, . . . , as exemplarily shown in FIG. 7. At that time, connectivity is decided by using a scalar product of vectors, for example.

At Step P11, points from the tracking start point to the last neighbor point are saved as one brain white matter fiber.

Figure 3:
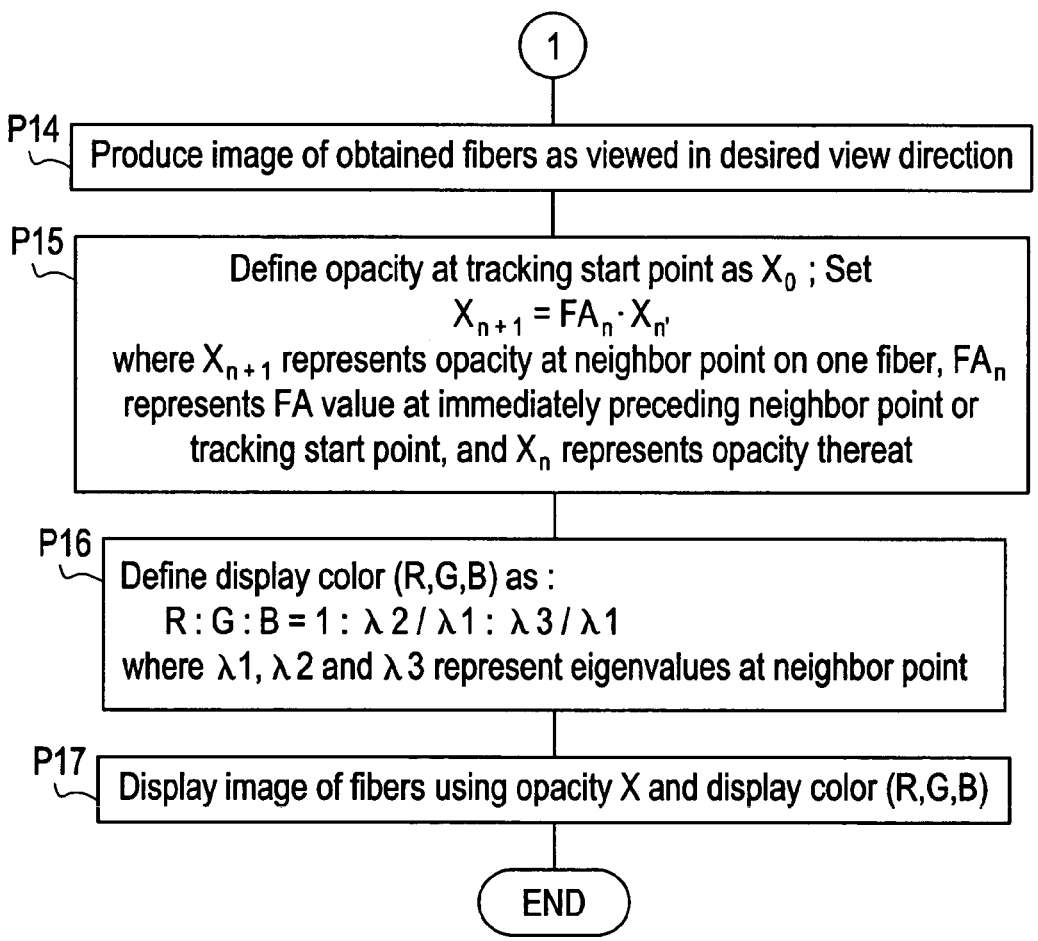
FIG. 3 is a flow chart continued from FIG. 2.

At Step P12, if any tracking start point not selected at Step P5 remains, the flow goes back to Step P5; otherwise, proceeds to Step P14 in FIG. 3.

Figure 8:
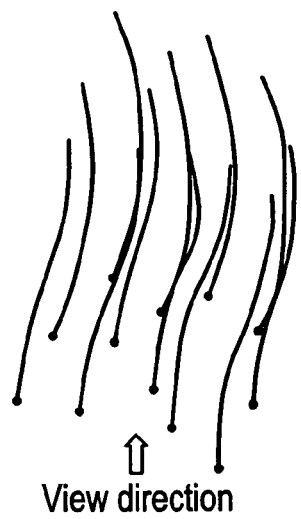
FIG. 8 exemplarily shows an image of obtained fibers as viewed in a desired view direction.

At Step P14 in FIG. 3, an image of the saved brain white matter fibers as viewed in a desired view direction is produced, as exemplarily shown in FIG. 8.

At Step P15, the opacity at the tracking start point is defined as $X_0$. Moreover, $$X_{n+1} = FA_n \cdot X_n$$

is set, where $X_{n+1}$ represents the opacity at a neighbor point, $FA_n$ represents the FA value at the immediately preceding neighbor point or tracking start point, and $X_n$ represents the opacity thereat.

At Step P16, the display color (R, G, B) is defined as:

$$R:G:B = 1:\lambda 2/\lambda 1:\lambda 3/\lambda 1,$$

where $\lambda 1$, $\lambda 2$ and $\lambda 3$ represent the eigenvalues of the diffusion tensor.

At Step P17, the image of the fibers is displayed using the opacity X and the display color (R, G, B).

Figure 9:
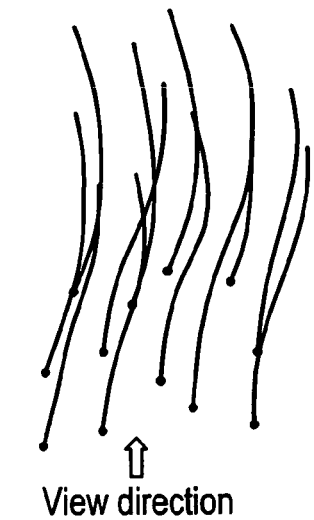
FIG. 9 exemplarily shows an image of the obtained fibers as viewed in another view direction.

According to the MRI apparatus 100 of the first embodiment, the following effects can be obtained:

(1) As shown in FIGS. 8 and 9, the number of tracking start points overlapping one another is approximately the same in various view directions. Therefore, a situation in which the fiber density looks as if it suddenly decreases in a specific view direction is prevented. Taking an overall view of the region of interest or volumetric region of interest, the density of the track start points is uniform and no density variation occurs;

(2) A portion of a rendered fiber having low transparency can be known to have high fiber tracking reliability, and a portion having high transparency can be known to have low fiber tracking reliability. Therefore, even when a portion having considerably low fiber tracking reliability is rendered by decreasing the threshold at Step P9 in FIG. 2, the portion with considerably low fiber tracking reliability and the portion with high reliability can be distinguished, which avoids hindrance to accurate diagnosis; and (3) The diffusion can be known as being more isotropic as the display color for the rendered fibers is closer to white, and as being more anisotropic as the display color is closer to red.

In addition, modifications as follows may be made:

(1) The opacity X may be calculated based on another indicator that reflects the diffusion anisotropy (for example, the eigenvalue ratio, $\lambda 2/\lambda 1$, $\lambda 3/\lambda 1$, relative anisotropy, volume ratio); and (2) The display color (R, G, B) may be determined as $R:G:B = \lambda 1/(\lambda 1 + \lambda 2 + 3):\lambda 2/(\lambda 1 \lambda 2 + 3):\lambda 3/(\lambda 1 + \lambda 2 + \lambda 3)$.

Second Embodiment

Figure 10:
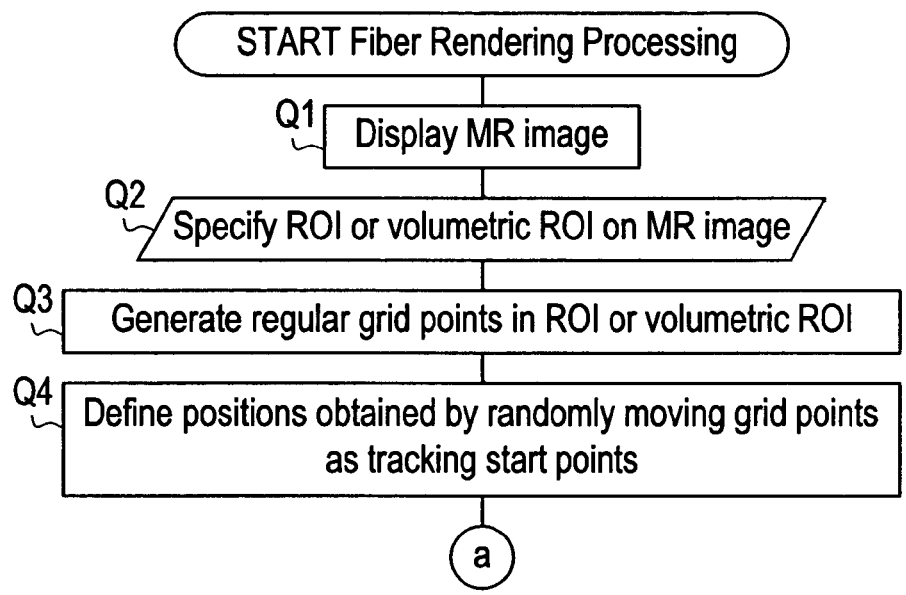
FIG. 10 is a flow chart showing fiber rendering processing in accordance with a second embodiment.

FIG. 10 is a flow chart showing fiber rendering processing by an MRI apparatus in accordance with a second embodiment.

At Step Q1, an MR image in an axial or oblique plane is produced from three-dimensional image data collected by a diffusion tensor method or another imaging method (T1- or T2-enhanced or the like) in the MRI apparatus, and the MR image is displayed.

At Step Q2, an operator specifies a two-dimensional region of interest R1 (or a three-dimensional volumetric region of interest) on a displayed MR image G1, as shown in FIG. 4.

At Step Q3, regular grid points g1, g2, g3, . . . are generated in the region of interest R1 (or in the volumetric region of interest), as shown in FIG. 5.

At Step Q4, points obtained by randomly moving the grid points g1, g2, g3, . . . in a two-dimensional (or three-dimensional) manner are defined as tracking start points S1, S2, S3, . . . , as shown in FIG. 6. Random numbers for the random moving can be generated using a distribution function such as a Gaussian distribution or uniform distribution. The flow then proceeds to Step Q5 in FIG. 11.

Figure 11:
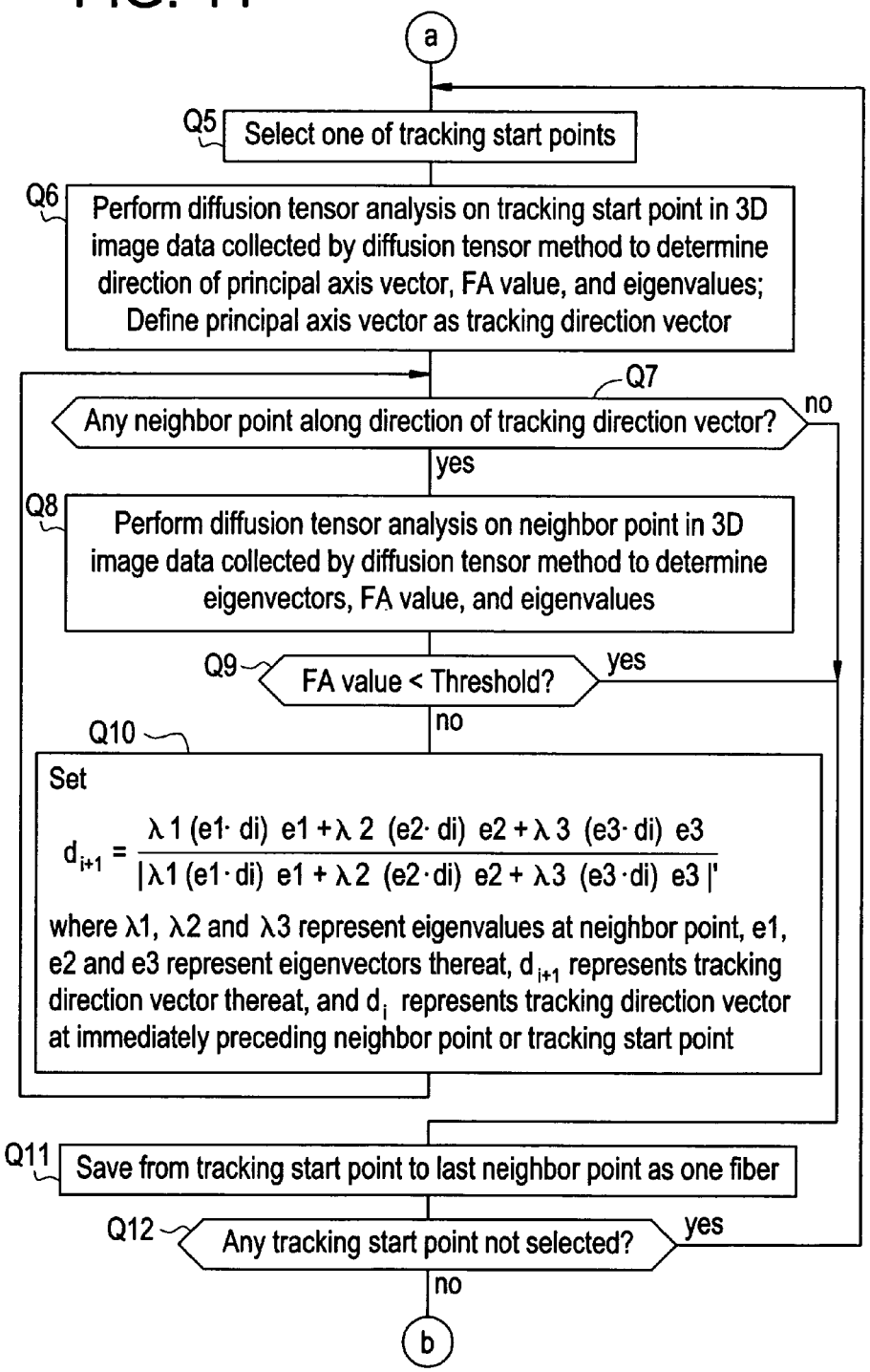
FIG. 11 is a flow chart continued from FIG. 10.

At Step Q5 in FIG. 11, one of the tracking start points is selected.

At Step Q6, diffusion tensor analysis is performed on the selected tracking start point in the three-dimensional image data collected by the diffusion tensor method in the MRI apparatus to determine the direction of the principal axis vector, the FA value, and the eigenvalues, and the principal axis vector is defined as a tracking direction vector.

At Step Q7, if three-dimensional image data corresponding to a point at a unit distance along the direction of the tracking direction vector is present, the point is defined as a neighbor point and the flow proceeds to Step Q8; and if no three-dimensional image data corresponding to a point at a unit distance along the direction of the principal axis vector is present, the flow proceeds to Step Q11.

At Step Q8, data at the neighbor point is created by interpolation or the like on the three-dimensional image data, and diffusion tensor analysis is performed to determine the eigenvectors, FA value, and eigenvalues.

At Step Q9, if the FA value is equal to or more than a threshold, the flow proceeds to Step Q10 to continue the fiber tracking because the fiber tracking has not reached an end portion of a brain white matter fiber; and if the FA value is less than the threshold, the flow proceeds to Step Q11 to terminate the fiber tracking because an end portion of a brain white matter fiber has been reached.

At Step Q10, $$d_{i+1} = \{\lambda 1(e_1 \cdot d_i)e_1 + \lambda 2(e_2 \cdot d_i)e_2 + \lambda 3(e_3 \cdot d_i)e_3\}/|\lambda 1(e_1 \cdot d_i) e_1 + \lambda 2(e_2 \cdot d_i)e_2 + \lambda 3(e_3 \cdot d_i)e_3|$$

is set, where $\lambda 1$, $\lambda 2$ and $\lambda 3$ represent the eigenvalues of the diffusion tensor at a neighbor point, e1, e2 and e3 represent the eigenvectors thereat, $d_{i+1}$ represents the tracking direction vector thereat, and $d_i$ represents the tracking direction vector at the immediately preceding neighbor point or tracking start point.

Figure 13:
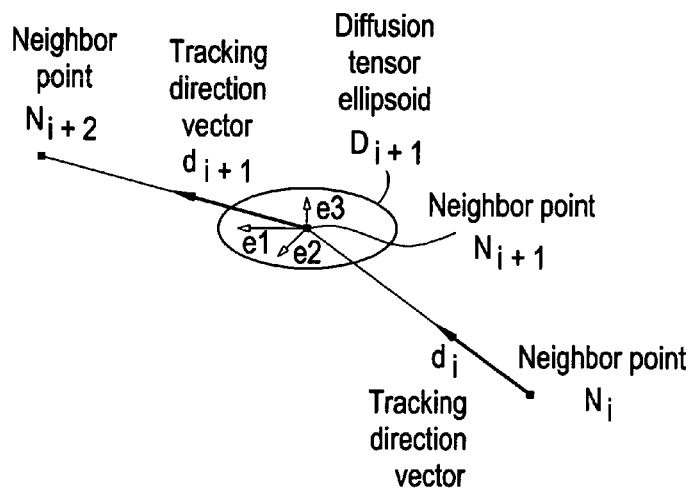
FIG. 13 is a conceptual diagram showing a tracking direction vector.

FIG. 13 is a conceptual diagram showing the tracking direction vector $d_{i+1}$.

The flow then goes back to Step Q7.

In this way, Steps Q7-Q10 are repeated until no more three-dimensional image data are found or the fiber tracking has reached an end portion of a brain white matter fiber, and a fiber is tracked from the tracking start point S1 to a neighbor point N1, N2, N3, . . . , as exemplarily shown in FIG. 7. At that time, connectivity is decided by using a scalar product of vectors, for example.

At Step Q11, points from the tracking start point to the last neighbor point are saved as one brain white matter fiber.

Figure 12:
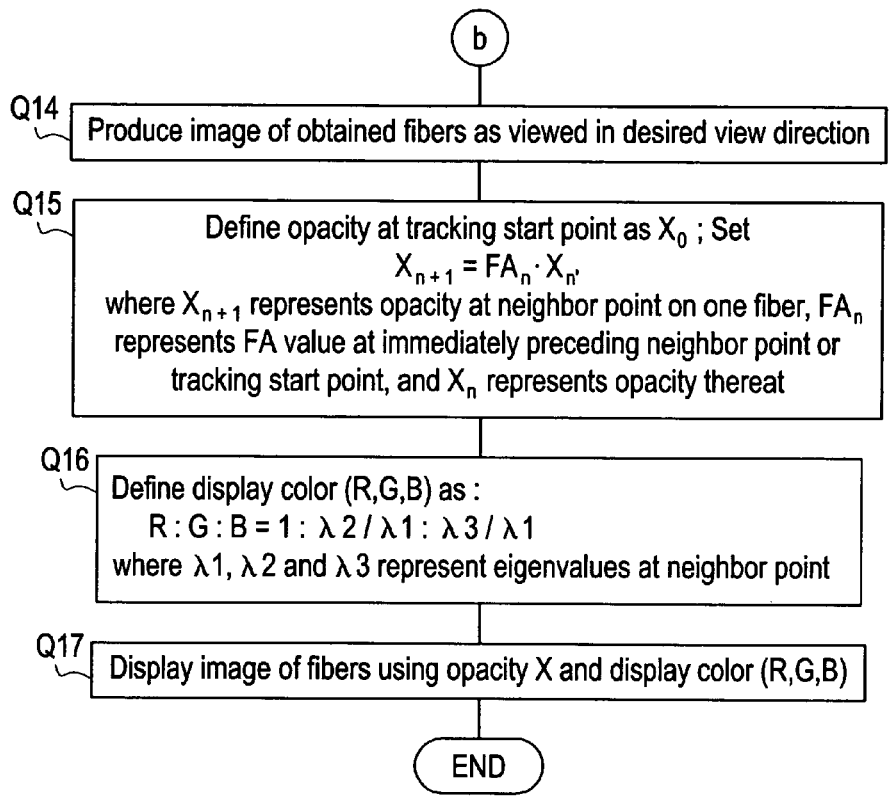
FIG. 12 is a flow chart continued from FIG. 11.

At Step Q12, if any tracking start point not selected at Step Q5 remains, the flow goes back to Step Q5; otherwise, proceeds to Step Q14 in FIG. 12.

At Step Q14 in FIG. 12, an image of the saved brain white matter fibers as viewed in a desired view direction is produced, as exemplarily shown in FIG. 8.

At Step Q15, the opacity at the tracking start point is defined as $X_0$. Moreover, $$X_{n+1} = FA_n \cdot X_n$$

is set, where $X_{n+1}$ represents the opacity at a neighbor point, $FA_n$ represents the FA value at the immediately preceding neighbor point or tracking start point, and $X_n$ represents the opacity thereat.

At Step Q16, the display color (R, G, B) is defined as:

$$R:G:B=1:\lambda2/\lambda1:\lambda3/\lambda1,$$

where $\lambda1$, $\lambda2$ and $\lambda3$ represent the eigenvalues of the diffusion tensor.

At Step Q17, the image of the fibers is displayed using the opacity X and the display color (R, G, B).

Figure 14:
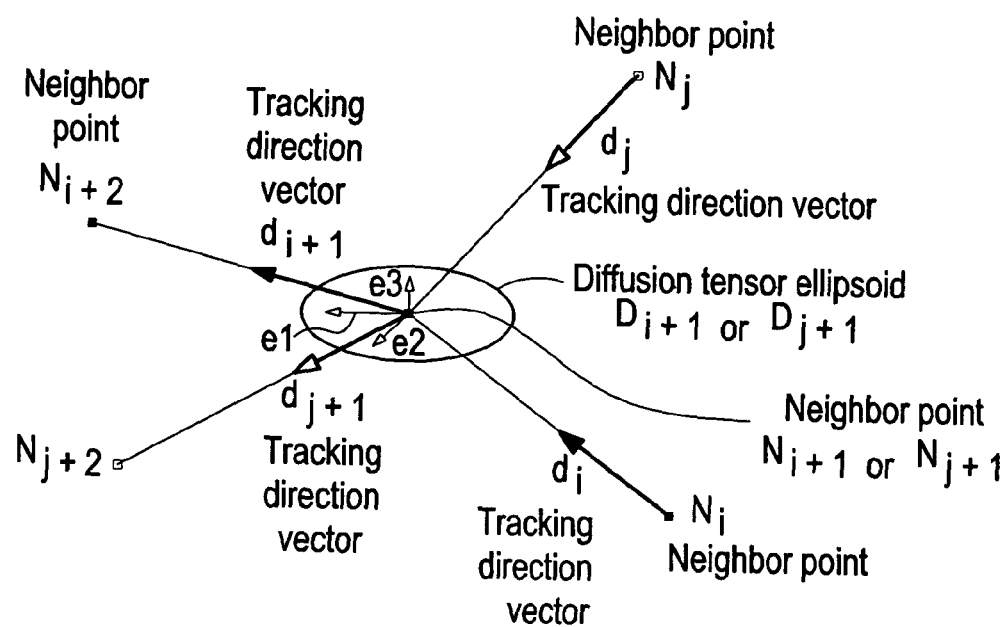
FIG. 14 is a conceptual diagram showing that the tracking directions are not mistaken even if fibers intersect each other.
Figure 15:
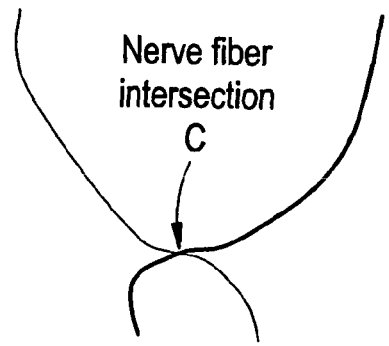
FIG. 15 is an explanatory diagram showing that the tracking direction is not mistaken even at a nerve fiber intersection.

According to the MRI apparatus of the second embodiment, the following effect can be obtained in addition to those in the first embodiment:

(4) As shown in FIG. 14, if the immediately preceding tracking direction vectors $d_i$ and $d_j$ are different, the tracking direction vectors $d_{i+1}$ and $d_{j+1}$ will be different even if the neighbor points $N_{i+1}$ and $N_{j+1}$ coincide with or lie close to each other. Therefore, nerve fibers in different connection directions can be distinguished based on the preceding connection directions even at a nerve fiber intersection C at which the nerve fibers in different connection directions intersect each other, as shown in FIG. 15, and the nerve fibers can be tracked without mistaking the direction.

In addition, to determine the tracking direction vector, an appropriate number N may be given to take an average vector of the next through N-th preceding tracking direction vectors.

Third Embodiment

Figure 16:
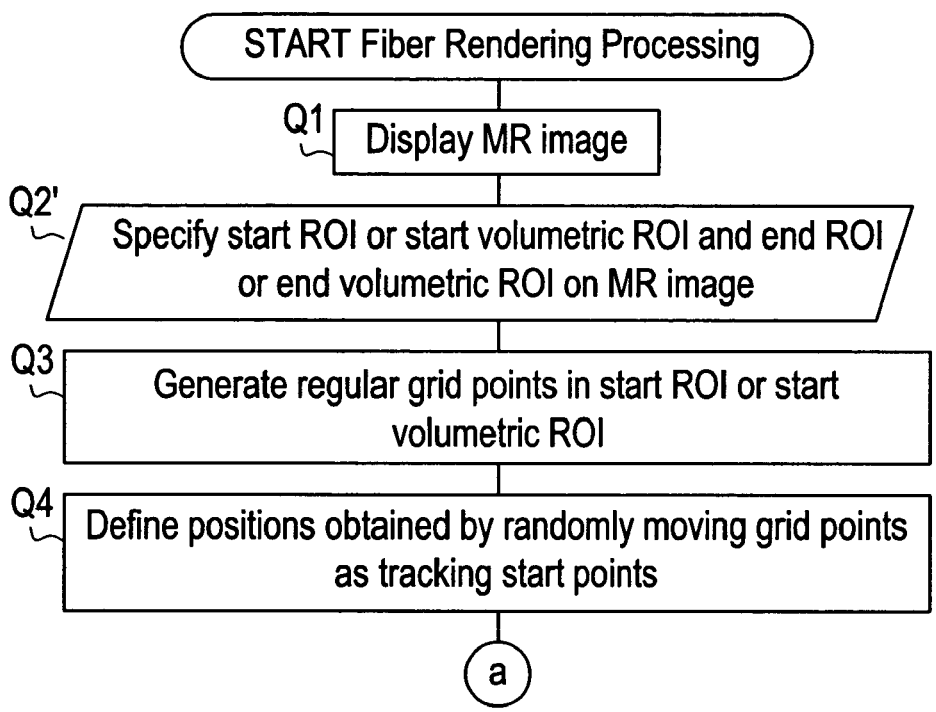
FIG. 16 is a flow chart showing fiber rendering processing in accordance with a third embodiment.

FIG. 16 is a flow chart showing fiber rendering processing by an MRI apparatus in accordance with a third embodiment.

At Step Q1, an MR image in an axial or oblique plane is produced from three-dimensional image data collected by a diffusion tensor method or another imaging method (T1- or T2-enhanced or the like) in the MRI apparatus, and the MR image is displayed.

Figure 19:
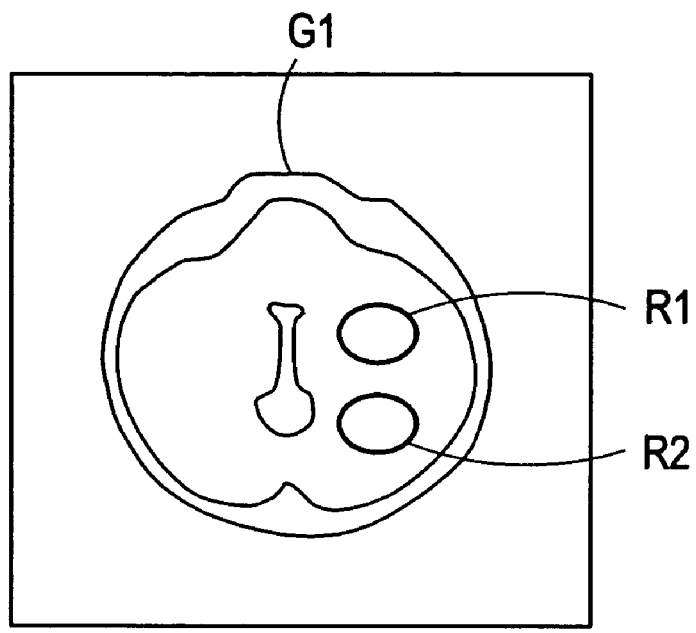
FIG. 19 exemplarily shows a screen for specifying start and end regions of interest.

At Step Q2', an operator specifies a two-dimensional start region of interest R1 (or a three-dimensional start volumetric region of interest) and a two-dimensional end region of interest R2 (or a three-dimensional end volumetric region of interest) on a displayed MR image G1, as shown in FIG. 19.

At Step Q3, regular grid points g1, g2, g3, ... are generated in the start region of interest R1 (or in the start volumetric region of interest), as shown in FIG. 5.

At Step Q4, points obtained by randomly moving the grid points g1, g2, g3, ... in a two-dimensional (or three-dimensional) manner are defined as tracking start points S1, S2, S3, ..., as shown in FIG. 6. Random numbers for the random moving can be generated using a distribution function such as a Gaussian distribution or uniform distribution. The flow then proceeds to Step Q5 in FIG. 17.

Figure 17:
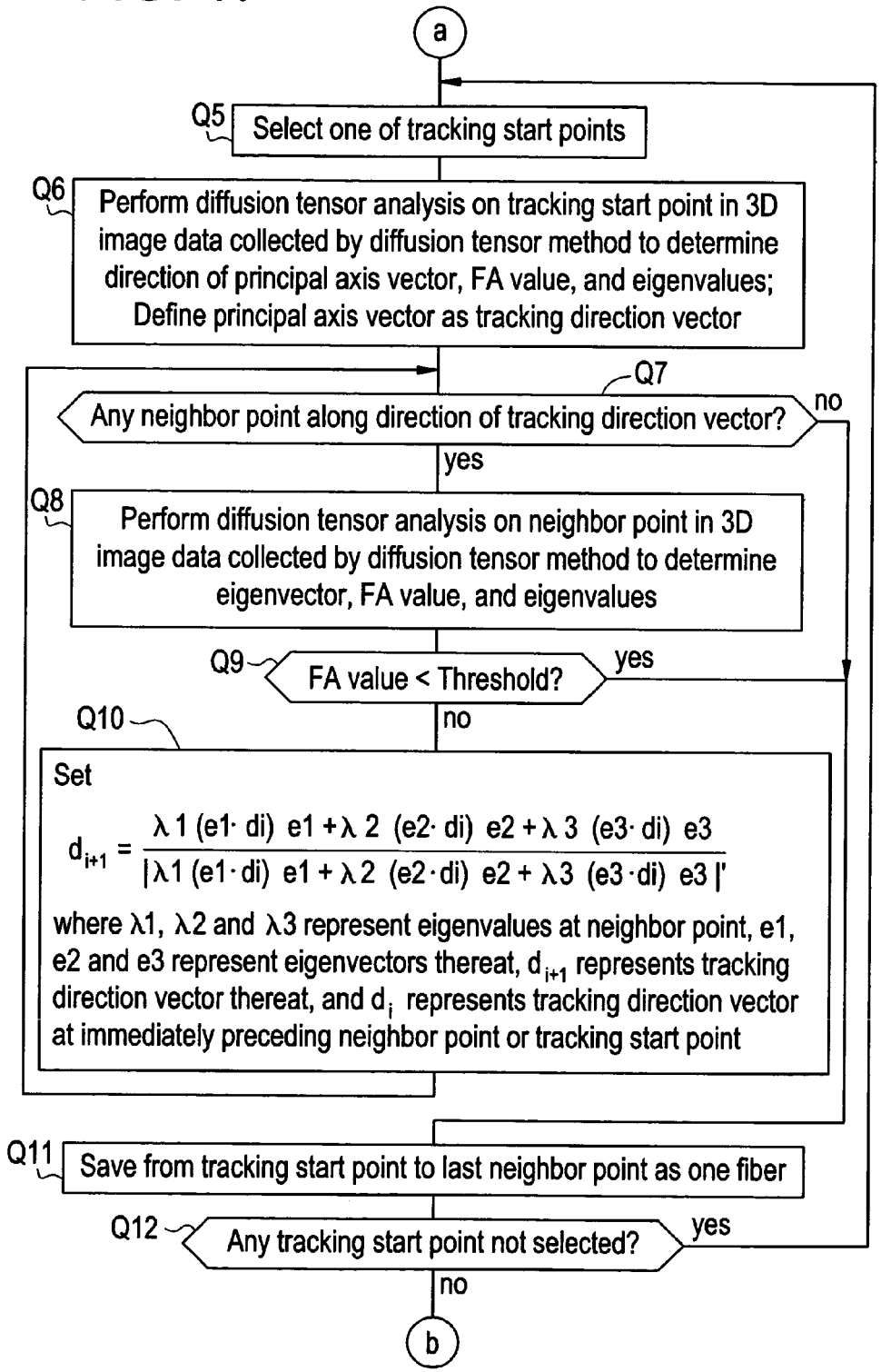
FIG. 17 is a flow chart continued from FIG. 16.

At Step Q5 in FIG. 17, one of the tracking start points is selected.

At Step Q6, diffusion tensor analysis is performed on the selected tracking start point in the three-dimensional image data collected by the diffusion tensor method in the MRI apparatus to determine the direction of the principal axis vector, the FA value, and the eigenvalues, and the principal axis vector is defined as a tracking direction vector.

At Step Q7, if a point at a unit distance along the direction of the tracking direction vector falls within the three-dimensional image data space, the point is defined as a neighbor point and the flow proceeds to Step Q8; and if the point falls outside the three-dimensional image data space, the flow proceeds to Step Q11.

At Step Q8, data at the neighbor point is created by interpolation or the like on the three-dimensional image data, and diffusion tensor analysis is performed to determine the eigenvectors, FA value, and eigenvalues.

At Step Q9, if the FA value is equal to or more than a threshold, the flow proceeds to Step Q10 to continue the fiber tracking because the fiber tracking has not reached an end portion of a brain white matter fiber; and if the FA value is less than the threshold, the flow proceeds to Step Q11 to terminate the fiber tracking because an end portion of a brain white matter fiber has been reached.

At Step Q10, $$d_{i+1}=\{\lambda1(e_1 \cdot d_i)e_1+\lambda2(e_2 \cdot d_i)e_2+\lambda3(e_3 \cdot d_i)e_3\}/|\lambda1(e_1 \cdot d_i) e_1+\lambda2(e_2 \cdot d_i)e_2+\lambda3(e_3 \cdot d_i)e_3|$$

is set, where $\lambda1$, $\lambda2$ and $\lambda3$ represent the eigenvalues of the diffusion tensor at a neighbor point, e1, e2 and e3 represent the eigenvectors thereat, $d_{i+1}$ represents tracking direction vector thereat, and $d_i$ represents the tracking direction vector at the immediately preceding neighbor point or tracking start point.

FIG. 13 is a conceptual diagram showing the tracking direction vector $d_{i+1}$.

The flow then goes back to Step Q7.

In this way, Steps Q7-Q10 are repeated until no more three-dimensional image data are found or the fiber tracking has reached an end portion of a brain white matter fiber, and a fiber is tracked from the tracking start point S1 to a neighbor point N1, N2, N3, ..., as exemplarily shown in FIG. 7. At that time, connectivity is decided by using a scalar product of vectors, for example.

At Step Q11, points from the tracking start point to the last neighbor point are saved as one brain white matter fiber.

At Step Q12, if any tracking start point that not selected at Step Q5 remains, the flow goes back to Step Q5; otherwise, proceeds to Step Q13 in FIG. 18.

At Step Q13 in FIG. 18, a decision is made as to whether the obtained fiber has an intersection with the end region of interest R2 (or the end volumetric region of interest), and the fiber is selected only if it has an intersection.

Figure 20:
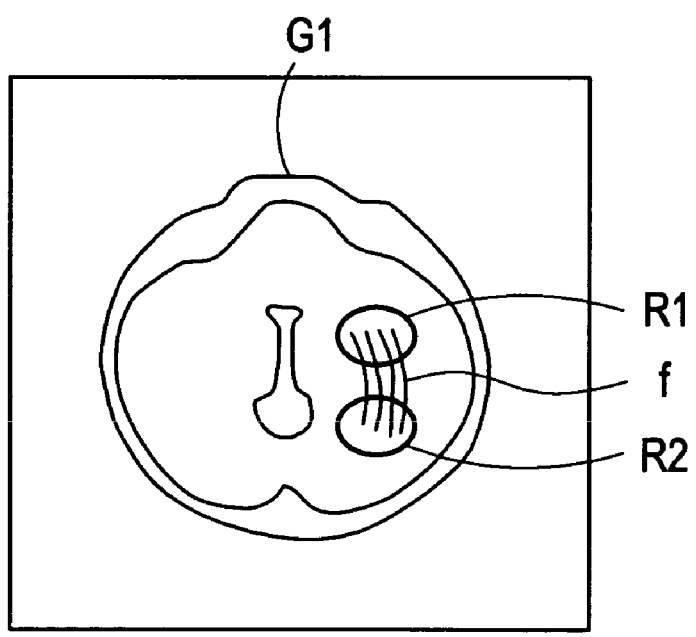
FIG. 20 exemplarily shows a screen that displays only the fibers connecting the start and end regions of interest.
Figure 21:
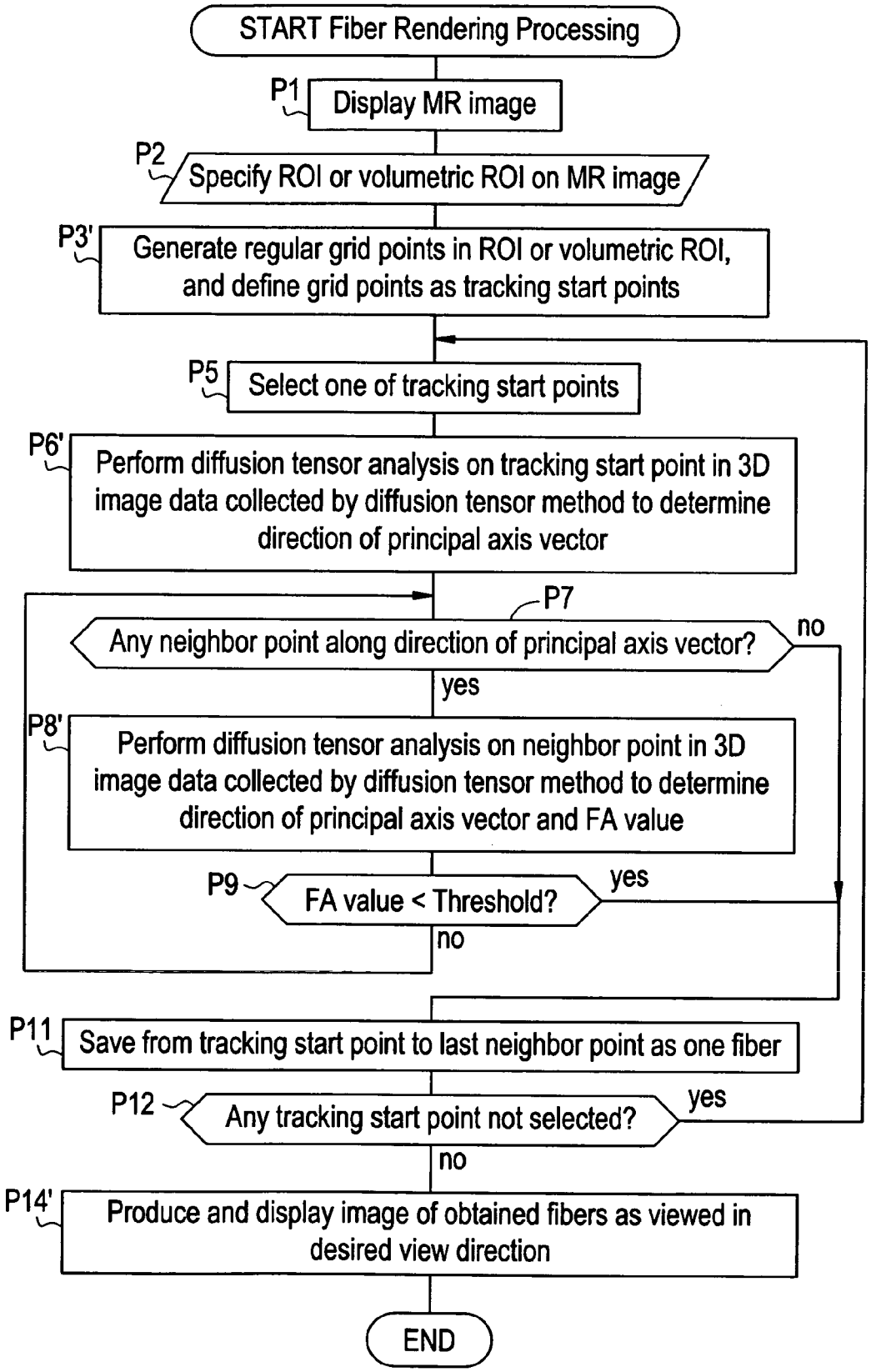
FIG. 21 is a flow chart showing conventional fiber rendering processing.
Figure 22:
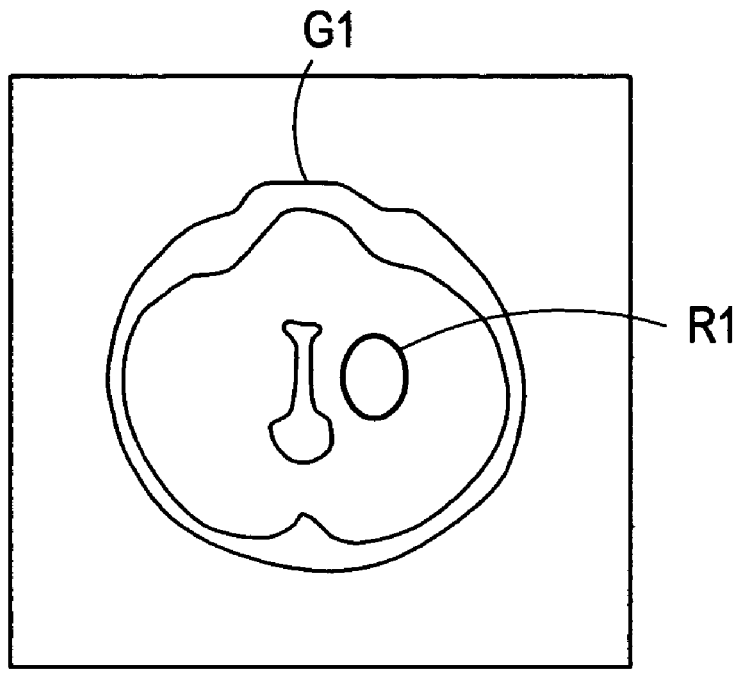
FIG. 22 exemplarily shows a screen for specifying a region of interest.
Figure 23:
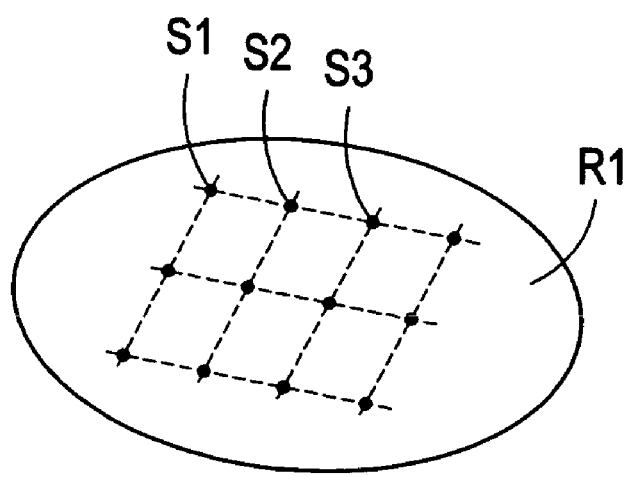
FIG. 23 exemplarily shows regularly arranged tracking start points.
Figure 24:
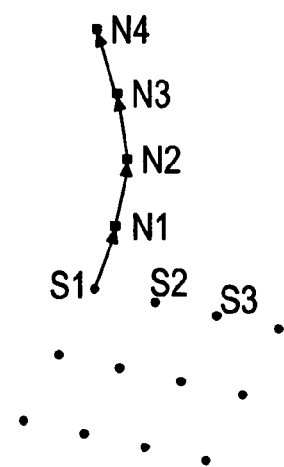
FIG. 24 is a conceptual diagram showing a fiber tracking condition.
Figure 25:
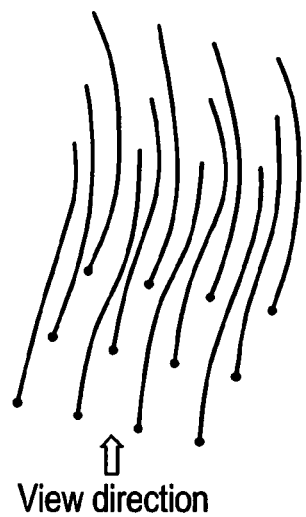
FIG. 25 exemplarily shows an image of obtained fibers as viewed in a desired view direction.
Figure 26:
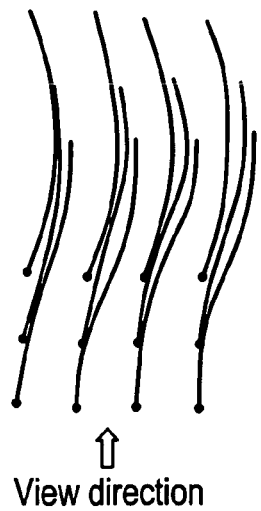
FIG. 26 exemplarily shows an image of the obtained fibers as viewed in another view direction.
Figure 27:
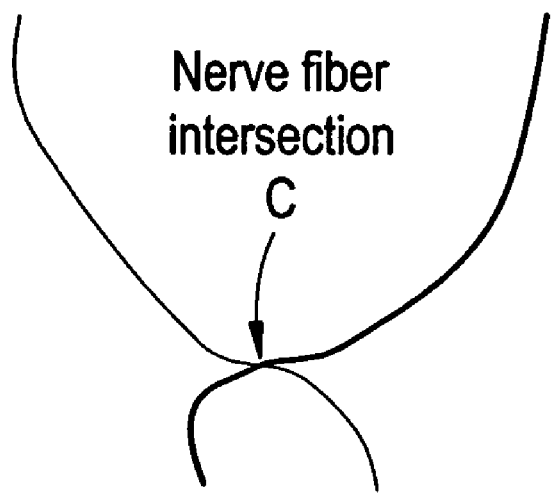
FIG. 27 is a conceptual diagram showing that fibers intersect each other at a nerve fiber intersection.
Figure 28:
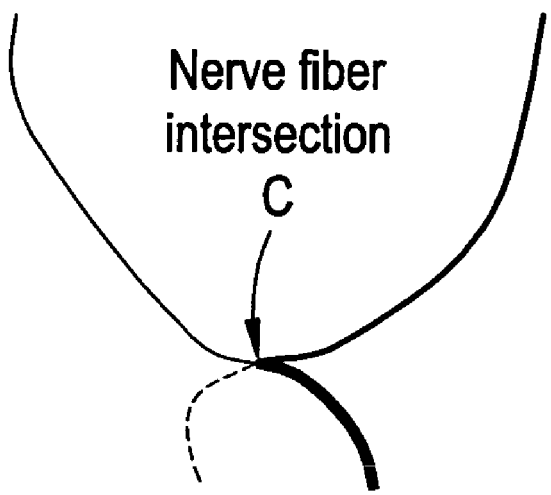
FIG. 28 is an explanatory diagram showing that the tracking direction is mistaken at the nerve fiber intersection.

At Step Q14', an image of only the selected brain white matter fibers $f$ as viewed in a desired view direction is produced, as exemplarily shown in FIG. 20.

At Step Q15, the opacity at the tracking start point is defined as $X_0$. Moreover, $$X_{n+1}=FA_n \cdot X_n$$

is set, where $X_{n+1}$ represents the opacity at a neighbor point, $FA_n$ represents the FA value at the immediately preceding neighbor point or tracking start point, and $X_n$ represents the opacity thereat.

At Step Q16, the display color (R, G, B) is defined as:

$$R:G:B=1:\lambda2/\lambda1:\lambda3/\lambda1,$$

where $\lambda1$, $\lambda2$ and $\lambda3$ represent the eigenvalues of the diffusion tensor.

At Step Q17, the image of the selected fibers is displayed using the opacity X and the display color (R, G, B).

At Step Q18, a total sum with respect to all the selected fibers:

$$M\_Value=\Sigma\lambda1 \cdot FA/L$$

is calculated and displayed, where λ1 represents the first eigenvalue of the diffusion tensor of the selected fiber, FA represents the FA value thereof, and L represents the total length of the fiber.

According to the MRI apparatus of the third embodiment, the following effects can be obtained in addition to those in the second embodiment:

(5) Since only the nerve fibers f passing through two sites are rendered, connectivity of the nerve fibers between the two sites can be visually recognized; and (6) Quantitative assessment is enabled by employing M_Value as an indicator of the strength of connection by nerve fibers between two sites.

It is possible to display an average M_Value by dividing M_Value by the number of selected fibers.

Moreover, the fibers may be displayed with the display brightness or display color changed according to M_Value.

Many widely different embodiments of the invention may be configured without departing from the spirit and the scope of the present invention. It should be understood that the present invention is not limited to the specific embodiments described in the specification, except as defined in the appended claims.

The invention claimed is:

1. A fiber rendering apparatus comprising:
   a device for specifying a region of interest or volumetric region of interest in three-dimensional image data collected by a diffusion tensor method in an MRJ apparatus;
   a device for defining regular grid points in the region of interest or volumetric region of interest;
   a device for defining points obtained by randomly moving the grid points based on a distribution function in a two-dimensional or three-dimensional manner as tracking start points;
   a device for performing diffusion tensor analysis on each tracking start point in the three-dimensional image data to determine a direction of a principal axis vector;
   a device for tracking a fiber by repeatedly selecting a neighbor point along the direction of the principal axis vector and performing diffusion tensor analysis on the neighbor point to determine a direction of a principal axis vector; and
   a device for producing and displaying an image of the tracked fibers as viewed in a desired view direction.

2. The fiber rendering apparatus of claim 1, wherein the image is displayed with display colors based on the tracking start points and neighbor points.

3. The fiber rendering apparatus of claim 1, wherein the image is displayed with opacity based on the tracking start points and neighbor points.

4. The fiber rendering apparatus of claim 1, wherein the tracked fibers are white brain matter fibers.

5. The fiber rendering apparatus of claim 1, wherein the grid points are randomly moved within a range such that, after moving, the points fall within intervals between the original locations of the grid points.

6. The fiber rendering apparatus of claim 1, wherein the grid points are moved based at least one of a Gaussian function and a uniform function.

7. The fiber rendering apparatus of claim 1, wherein the device for tracking a fiber is capable of tracking the fiber when a fiber density decreases in a three-dimensional volume.

8. A fiber rendering apparatus comprising:
   a device for defining tracking start points in three-dimensional image data collected by a diffusion tensor method in an MRI apparatus, wherein the tracking start points are generated by randomly displacing a plurality of grid points located in a region of interest based on a distribution function;
   a device for performing diffusion tensor analysis on each tracking start point in the three-dimensional image data to determine a direction of a principal axis vector and a diffusion anisotropy value;
   a device for tracking a fiber by repeatedly selecting a neighbor point along the direction of the principal axis vector and performing diffusion tensor analysis on the neighbor point to determine a direction of a principal axis vector and a diffusion anisotropy value; and
   a device for producing an image of the tracked fibers as viewed in a desired view direction and displaying the image with opacity reflecting the diffusion anisotropy values at the tracking start points and neighbor points.

9. The fiber rendering apparatus of claim 8, wherein an FA value is used as the diffusion anisotropy value.

10. The fiber rendering apparatus of claim 9, wherein $$X_{n+1}=FA_n X_n,$$

where $X_{n+1}$ represents an opacity at a neighbor point, $FA_n$ represents an FA value at the immediately preceding neighbor point or tracking start point, and $X_n$ represents an opacity thereat.

11. The fiber rendering apparatus of claim 8, wherein the tracked fibers are white brain matter fibers.

12. The fiber rendering apparatus of claim 8, wherein the grid points are randomly moved within a range such that, after moving, the points fall within intervals between the original locations of the grid points.

13. The fiber rendering apparatus of claim 8, wherein the grid points are moved based at least one of a Gaussian function and a uniform function.

14. The fiber rendering apparatus of claim 8, wherein the device for tracking a fiber is capable of tracking the fiber when a fiber density decreases in a three-dimensional volume.

15. A fiber rendering apparatus comprising:
   a device for defining tracking start points in three-dimensional image data collected by a diffusion tensor method in an MRI apparatus, wherein the tracking start points are generated by randomly displacing a plurality of grid points located in a region of interest based on a distribution function;
   a device for performing diffusion tensor analysis on each tracking start point in the three-dimensional image data to determine a direction of a principal axis vector and eigenvalues of a diffusion tensor;
   a device for tracking a fiber by repeatedly selecting a neighbor point along the direction of the principal axis vector and performing diffusion tensor analysis on the neighbor point to determine a direction of a principal axis vector and eigenvalues of a diffusion tensor; and
   a device for producing an image of the tracked fibers as viewed in a desired view direction and displaying the image with display colors reflecting the eigenvalues of the diffusion tensors at the tracking start points and neighbor points.

16. The fiber rendering apparatus of claim 15, wherein a display color (R, G, B) is defined as:

R:G:B=1:$\lambda 2/\lambda 1$:$\lambda 3/\lambda 1$, where $\lambda 1$, $\lambda 2$ and $\lambda 3$ represent eigenvalues of a diffusion tensor.

17. The fiber rendering apparatus of claim 15, wherein the tracked fibers are white brain matter fibers.

18. The fiber rendering apparatus of claim 15, wherein the grid points are randomly moved within a range such that, after moving, the points fall within intervals between the original locations of the grid points.

19. The fiber rendering apparatus of claim 15, wherein the grid points are moved based at least one of a Gaussian function and a uniform function.

20. The fiber rendering apparatus of claim 15, wherein the device for tracking a fiber is capable of tracking the fiber when a fiber density decreases in a three-dimensional volume.

* * * * *